US 9,472,595 B1

United States Patent
Zhou et al.

(10) Patent No.: US 9,472,595 B1
(45) Date of Patent: Oct. 18, 2016

(54) PERPENDICULAR MRAM WITH MAGNET

(71) Applicant: Avalanche Technology, Inc., Fremont, CA (US)

(72) Inventors: Yuchen Zhou, San Jose, CA (US); Bing K. Yen, Cupertino, CA (US); Yiming Huai, Pleasanton, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/667,590

(22) Filed: Mar. 24, 2015

(51) Int. Cl.
    *H01L 27/22* (2006.01)
    *H01L 43/02* (2006.01)
    *H01L 43/08* (2006.01)
    *H01L 43/10* (2006.01)

(52) U.S. Cl.
    CPC ............ *H01L 27/222* (2013.01); *H01L 43/02* (2013.01); *H01L 43/08* (2013.01); *H01L 43/10* (2013.01)

(58) Field of Classification Search
    CPC ............................ H01L 27/222; H01L 43/10
    See application file for complete search history.

(56) References Cited

U.S. PATENT DOCUMENTS

| | | | | |
|---|---|---|---|---|
| 6,621,731 B2* | 9/2003 | Bessho | G11C 11/16 | 365/151 |
| 7,719,883 B2* | 5/2010 | Hochstrat | G11C 11/16 | 365/158 |
| 8,064,246 B2* | 11/2011 | Slonczewski | B82Y 25/00 | 365/145 |
| 8,107,281 B2* | 1/2012 | Kai | G11C 11/16 | 365/148 |
| 8,729,648 B2* | 5/2014 | Suzuki | H01L 43/02 | 257/421 |
| 9,041,130 B2* | 5/2015 | Kobayashi | H01L 27/222 | 257/421 |
| 2009/0073737 A1* | 3/2009 | Klostermann | G11C 5/02 | 365/53 |
| 2013/0015542 A1* | 1/2013 | Wang | H01L 43/08 | 257/421 |
| 2013/0241014 A1* | 9/2013 | Katti | G06F 21/86 | 257/421 |
| 2014/0085969 A1* | 3/2014 | Saida | G11C 11/1675 | 365/158 |

* cited by examiner

*Primary Examiner* — William Coleman
(74) *Attorney, Agent, or Firm* — Bing K. Yen

(57) ABSTRACT

The present invention is directed to a magnetic random access memory (MRAM) comprising an MRAM die having a front side that includes therein a plurality of perpendicular magnetic tunnel junction (MTJ) memory elements and a back side; and a sheet of permanent magnet disposed in close proximity to the MRAM die with a sheet surface facing the front side or back side of the MRAM die. The sheet of permanent magnet has a permanent magnetization direction substantially perpendicular to the sheet surface facing the MRAM die and exerts a magnetic field that eliminate or minimize the offset field of the magnetic free layer. The MRAM die and the sheet of permanent magnet may be encapsulated by a package case. The MRAM may further comprise a soft magnetic shield disposed on a side of the MRAM die opposite the sheet of permanent magnet.

18 Claims, 10 Drawing Sheets

WRITING TO LOW RESISTANCE    WRITING TO HIGH RESISTANCE

PERPENDICULAR MRAM WITH MAGNET

BACKGROUND

The present invention relates to a memory that includes a magnet packaged therein, and more particularly, to a perpendicular magnetic random access memory (MRAM) packaged with a permanent magnet to improve programming characteristics thereof.

Spin transfer torque magnetic random access memory (STT-MRAM) is a new class of non-volatile memory, which can retain the stored information when powered off. An STT-MRAM device normally comprises an array of memory cells, each of which includes a magnetic memory element and a selection transistor coupled in series between appropriate electrodes. Upon application of a switching current to the magnetic memory element, the electrical resistance of the magnetic memory element would change accordingly, thereby switching the stored logic in the respective memory cell.

FIG. 1 is a schematic circuit diagram of an STT-MRAM device 30, which comprises a plurality of memory cells 32 with each of the memory cells 32 including a selection transistor 34 coupled to a magnetic memory element 36; a plurality of parallel word lines 38 with each being coupled to the gates of a respective row of the selection transistors 34 in a first direction; and a plurality of parallel bit lines 40 with each being coupled to a respective row of the memory elements 36 in a second direction substantially perpendicular to the first direction; and optionally a plurality of parallel source lines 42 with each being coupled to a respective row of the selection transistors 34 in the first or second direction.

The magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

FIGS. 2A and 2B illustrate programming operations of an STT-MRAM cell including a perpendicular MTJ memory element 80 coupled to a selection transistor 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 2A illustrates the writing process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90. It should be noted that the parallelizing write current ($i^P$) 98 flows in the opposite direction as the electrons.

Conversely, FIG. 2B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{ap}$) 100 exceeds a threshold level.

The voltages required to drive the parallelizing current ($i^P$) 98 and the anti-parallelizing current ($i^{ap}$) 100 should ideally be similar in order to accommodate the control and power circuitry, which is normally designed and optimized for symmetric switching voltages. In the MTJ memory element 80, however, the magnetic reference layer 84 exerts an external magnetic field perpendicular to the layer plane thereof upon the magnetic free layer 88, causing the switching voltages to become asymmetric. Therefore, the stray magnetic field exerted by the magnetic reference layer 84 upon the magnetic free layer 88, also known as the offset field, needs to be eliminated or minimized to ensure symmetric switching behavior.

One approach for eliminating the offset field of the magnetic free layer 88 is to add one or more magnetic layers with fixed magnetization to the MTJ memory element 80 in order to counter-balance or cancel the stray magnetic field exerted by the magnetic reference layer 84. FIG. 3A shows an exemplary MTJ memory element 110 comprising the MTJ memory element 80 and a magnetic fixed layer 112 separated from the magnetic reference layer 84 by a non-magnetic coupling layer 114. The magnetic fixed layer 112 has a second fixed magnetization direction 116 that is perpendicular to the layer plane thereof and is substantially opposite to the first magnetization direction 86 of the magnetic reference layer 84. Another exemplary MTJ memory element 120 illustrated in FIG. 3B includes the MTJ memory element 80 and a magnetic compensation layer 122 separated from the magnetic free layer 88 by a non-magnetic spacer layer 124. The magnetic compensation layer 122 has a third fixed magnetization direction 126 that is perpendicular to the layer plane thereof and is substantially opposite to the first magnetization direction 86 of the magnetic reference layer 84.

While the magnetic fixed layer 112 and the magnetic compensation layer 122 may eliminate or minimize the offset field of the magnetic free layer 88 by counter-balancing the stray magnetic field exerted by the magnetic reference layer 84, the addition of the magnetic fixed layer 112 and the magnetic compensation layer 112 disadvantageously increases the total film stack thickness, which may complicate the etching and integration processes. Etching of magnetic material, which cannot be readily volatilized by chemical reactions with common etching vapors, is mostly a physical sputtering process that may redeposit sputtered magnetic material on the sidewall of the insulating tunnel junction layer 92 and cause the electrical shunting of the MTJ memory element. Therefore, the propensity for shunting of the MTJ memory element increases with increasing amount of magnetic material to be etched.

For the foregoing reasons, there is a need for an MRAM that has a desired symmetric switching behavior and that can be inexpensively manufactured with high yield.

SUMMARY

The present invention is directed to a magnetic random access memory (MRAM) that satisfies this need. The MRAM having features of the present invention comprises an MRAM die having a front side that includes therein a plurality of perpendicular magnetic tunnel junction (MTJ) memory elements and a back side; and a sheet of permanent magnet disposed in close proximity to the MRAM die with a sheet surface facing the front side or back side of the MRAM die. Each of the plurality of perpendicular MTJ memory elements may comprise a magnetic reference layer having a fixed magnetization direction substantially perpendicular to a layer plane thereof, a magnetic free layer having a variable magnetization direction substantially perpendicular to a layer plane thereof, and an insulating tunnel junction layer interposed between the magnetic reference layer and the magnetic free layer. The sheet of permanent magnet has a fixed or permanent magnetization direction substantially perpendicular to the sheet surface facing the MRAM die and exerts a magnetic field that cancels or counter-balances the stray magnetic field exerted on the magnetic free layer, thereby eliminating or minimizing the offset field. The MRAM die and the sheet of permanent magnet may be encapsulated in a package case. The MRAM may further comprise a soft magnetic shield disposed on a side of the MRAM die opposite the sheet of permanent magnet.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 4:
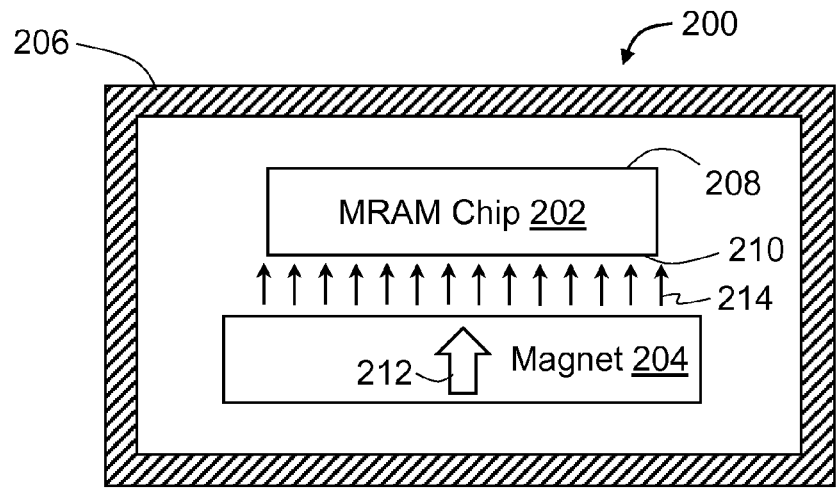
FIG. 4 is a schematic view of an embodiment of the present invention as applied to an MRAM.

An embodiment of the present invention as applied to a magnetic random access memory (MRAM) will now be described with reference to FIG. 4. Referring now to FIG. 4, the illustrated MRAM 200 comprises an MRAM die 202, a permanent magnet 204 disposed in close proximity thereto, and a supporting package case 206 for encapsulating and protecting the MRAM die 202 and the permanent magnet 204 disposed within the cavity defined by the package case 206. The supporting package case 206 may be made of any suitable insulator material, such as polymer or ceramic material.

Figure 1:
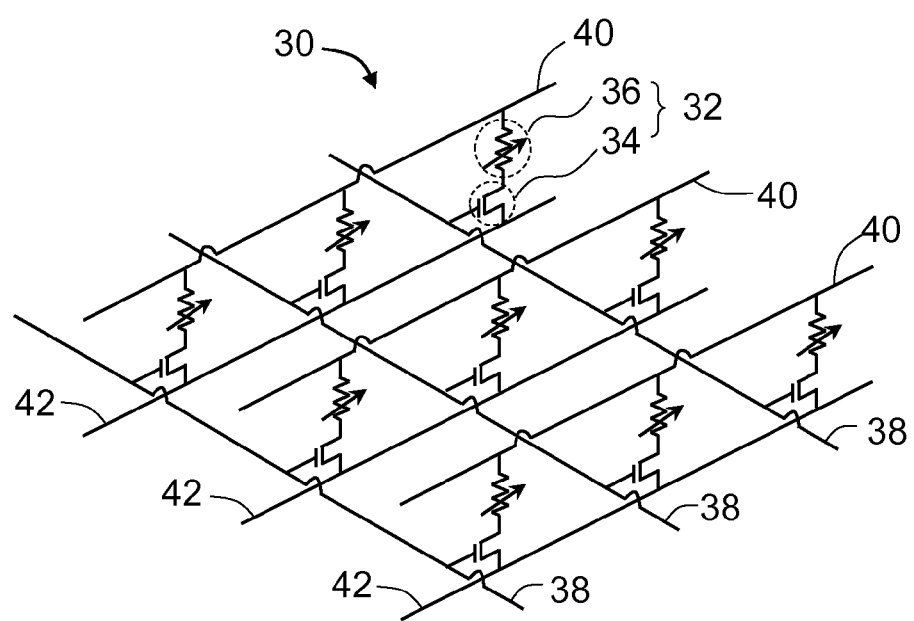
FIG. 1 is a schematic circuit diagram of an STT-MRAM device.
Figure 2A:
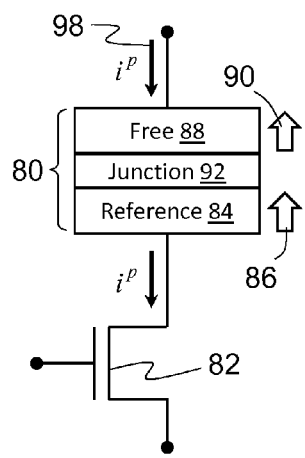
FIGS. 2A and 2B are schematic drawings illustrating writing processes of an STT-MRAM element to low and high resistance state, respectively.
Figure 2B:
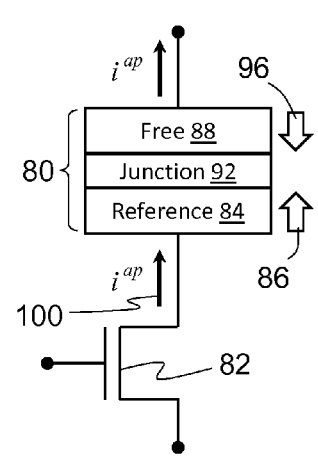

The MRAM die 202, which may be diced from a larger wafer comprising device layers formed on a substrate, has a front side 208 and a back side 210 opposite thereto. The front side 208 includes the device layers (not shown), such as layers of transistors and memory elements, while the back side 210 is a surface of the substrate that is substantially free of devices. The MRAM die 202 includes a plurality of perpendicular MTJ memory elements (not shown) formed on the front side 208. Each of the plurality of perpendicular MTJ memory elements may have a structure analogous to the perpendicular MTJ memory element 80 of FIGS. 2A and 2B, comprising a magnetic reference layer 84 and a magnetic free layer 88 with an insulating tunnel junction layer 92 interposed therebetween. The magnetic reference layer 84 has a first fixed magnetization direction 86 substantially perpendicular to the layer plane thereof. The magnetic free layer 88 has a variable magnetization direction 90/96 substantially perpendicular to the layer plane thereof.

Figure 3A:
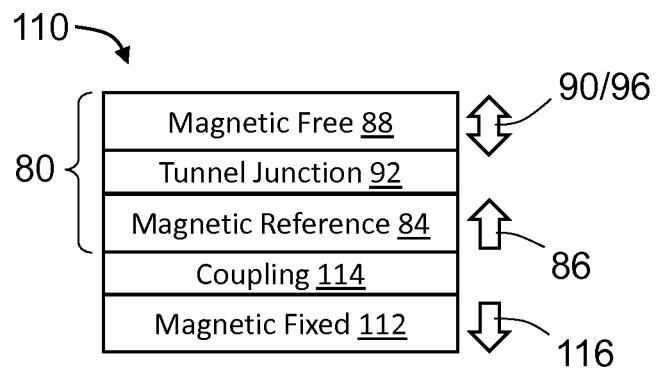
FIGS. 3A and 3B are schematic views of alternative STT-MRAM elements that are compatible with the present invention.

Each of the plurality of perpendicular MTJ memory elements may further include additional layers, such as but not limited to coupling layer, magnetic fixed layer, spacer layer, magnetic compensation layer, seed layer, and capping layer. For example, each perpendicular MTJ memory element may have a structure analogous to the perpendicular MTJ memory element 110 of FIG. 3A, comprising a magnetic reference layer 84 and a magnetic free layer 88 with an insulating tunnel junction layer 92 interposed therebetween, and a magnetic fixed layer 112 anti-ferromagnetically coupled to the magnetic reference layer 84 through an anti-ferromagnetic coupling layer 114. The magnetic fixed layer 112 has a second fixed magnetization direction 116 that is substantially perpendicular to the layer plane thereof and is substantially opposite to the first fixed magnetization direction 86 of the magnetic reference layer 84.

Figure 3B:
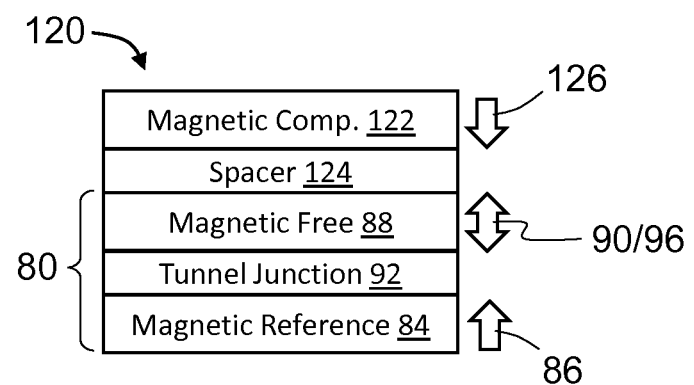

Each of the plurality of perpendicular MTJ memory elements may alternatively have a structure analogous to the perpendicular MTJ memory element 120 of FIG. 3B, comprising a magnetic reference layer 84 and a magnetic free layer 88 with an insulating tunnel junction layer 92 interposed therebetween, and a magnetic compensation layer 122 separated from the magnetic free layer 88 by a spacer layer 124. The magnetic compensation layer 122 has a third fixed magnetization direction 126 that is substantially perpendicular to the layer plane thereof and is substantially opposite to the first fixed magnetization direction 86 of the magnetic reference layer 84.

The layer stacking order of each of the plurality of perpendicular MTJ memory elements may be inverted without affecting the device performance. For example, each perpendicular MTJ memory element may have a structure in which the magnetic reference layer 84 of FIGS. 2A, 2B, 3A, and 3B is disposed on top of the insulating tunnel junction layer 92 and the magnetic free layer 88.

The magnetic free layer 88, the magnetic reference layer 84, the magnetic fixed layer 112, and the magnetic compensation layer 122 of the perpendicular MTJ memory element may be made of any suitable magnetic material or structure. One or more of the magnetic free layer 88, the magnetic reference layer 84, the magnetic fixed layer 112, and the magnetic compensation layer 122 may comprise at least one ferromagnetic element, such as but not limited to cobalt (Co), nickel (Ni), or iron (Fe), to form a suitable magnetic material, such as but not limited to Co, Ni, Fe, CoNi, CoFe, NiFe, or CoNiFe. The magnetic material of the one or more of the above magnetic layers may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), or phosphorus (P), to form a magnetic alloy or compound, such as but not limited to cobalt-iron-boron (CoFeB), iron-platinum (FePt), cobalt-platinum (CoPt), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), or cobalt-iron-phosphorous (CoFeP).

One or more of the above magnetic layers 84, 88, 112, and 122 may alternatively have a multilayer structure formed by interleaving layers of a first type of material with layers of a second type of material with at least one of the two types of materials being magnetic, such as but not limited to [Co/Pt], [Co/Pd], [Co/Pt(Pd)], [Co/Ni], [CoFe/Pt], [CoFe/Pd], [CoFe/Pt(Pd)], [CoFe/Ni], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 92. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Still alternatively, one or more of the above magnetic layers 84, 88, 112, and 122 may comprise two, three, four, or more magnetic sublayers with each magnetic sublayer being made of any suitable magnetic material, including magnetic metal, alloy, compound, or multilayer structure, as described in the preceding paragraphs above. The magnetic sublayers of a magnetic layer may form adjacent to each other and may have the same magnetization direction.

The insulating tunnel junction layer 92 may be formed of a suitable insulating material containing oxygen, nitrogen, or both, such as but not limited to magnesium oxide (MgO), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), silicon oxide ($SiO_x$), silicon nitride ($SiN_x$), or any combination thereof. The insulating tunnel junction layer 92 may have a halite-like cubic lattice structure.

The coupling layer 114, which may anti-ferromagnetically couple the magnetic fixed layer 112 to the magnetic reference layers 84, may have a single layer structure or may comprise two, three, four, or more sublayers formed adjacent to each other. One or more of the single layer and the multiple sublayers of the coupling layer 114 may be made of a suitable coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof.

With continuing reference to FIG. 4, the front side 208 of the MRAM die 202 may have conductive bond pads (not shown) that are electrically connected to a set of package bond pads (not shown) formed on the package case 206. The permanent magnet 204 may be in the form of a block or sheet and may be disposed in close proximity to the MRAM die 202 with a block or sheet surface facing the back side 210 of the MRAM die 202. The permanent magnet 204 has a fixed or permanent magnetization direction 212 substantially perpendicular to the block or sheet surface thereof and exerts a magnetic field 214 substantially perpendicular to the plane of the MRAM die 202 that substantially cancels or counter-balances the stray field exerted on the magnetic free layers of the perpendicular MTJ memory elements by other magnetic layers, thereby eliminating or minimizing the offset field. The thickness of the permanent magnet 204 and the distance between the permanent magnet 204 and the perpendicular MTJ memory elements in the MRAM die 202 may be varied to adjust the offset field. The permanent magnet 204 may have larger planar dimensions than the MRAM die 202 in order to improve the uniformity of the magnetic field 214. The permanent magnet 204 may alternatively be disposed adjacent to the front side 208 of the MRAM die 202. In such a case, the permanent magnet 204 may need to have via holes (not shown), through which the electrical connections between the conductive bond pads formed on the front side 208 and the package bond pads formed on the package case 206 may pass.

The permanent magnet 204 may be in a free-standing block or sheet form and may be made of any "hard" ferromagnetic material having suitably high coercivity and remanence. The permanent magnet 204 may have a remanence greater than about 0.1 Tesla (T), preferably greater than about 0.4 T, more preferably greater than about 0.7 T, even more preferably between about 1.0 T and about 1.6 T. The permanent magnet 204 may be a rare-earth magnet, such as but not limited to $SmCo_5$, $Nd_2Fe_{14}B$, or $Sm_2Co_{17}$, which comprises at least one rare-earth element, such as Nd or Sm, and at least one ferromagnetic element, such as Fe, Co, or Ni. The permanent magnet 204 may alternatively be a hard ferrite magnet such as $BaFe_{12}O_{19}$ or $SrFe_{12}O_{19}$. Still alternatively, the permanent magnet 204 may be made of a magnetic alloy comprising Co, Ni, and Al.

Figure 5:
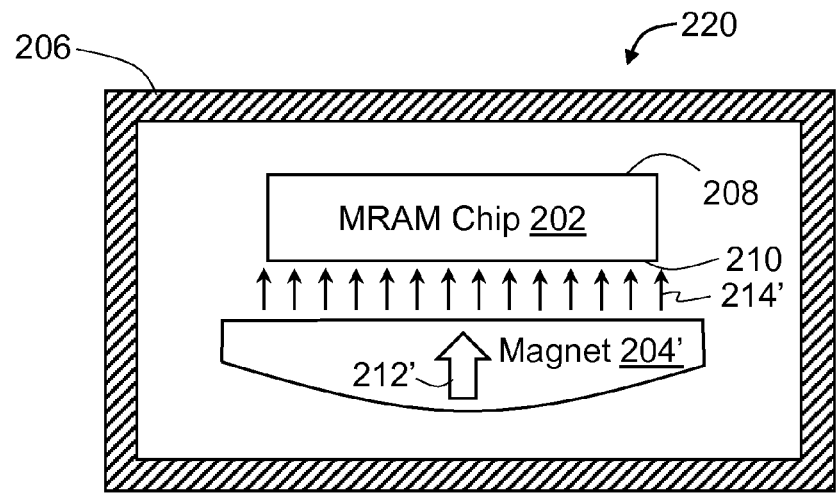
FIG. 5 is a schematic view of another embodiment in which the thickness of the permanent magnet varies.

The block or sheet thickness of the permanent magnet 204 may be varied within the planar area thereof to optimize the perpendicular magnetic field 214. FIG. 5 shows another embodiment of the present invention as applied to a magnetic random access memory. The illustrated memory 220 comprises the MRAM die 202, a permanent magnet 204' disposed in close proximity thereto, and the supporting package case 206 for encapsulating and protecting the MRAM die 202 and the permanent magnet 204'. The memory 220 of FIG. 5 differs from the memory 200 of FIG. 4 in that the permanent magnet 204', which has a permanent magnetization direction 212' substantially perpendicular to the surface of the MRAM die 202, is thicker at planar center and becomes thinner towards edges, thereby generating a more uniform perpendicular magnetic field 214' that counter-balances the offset field in the MRAM die 202. Moreover, the surface of the permanent magnet 204' facing the MRAM die 202 is preferably flat. Alternatively, the permanent magnet 204' may have other thickness profiles to accommodate non-uniform distributions of the offset field or different operating conditions in the MRAM die 202.

Figure 6:
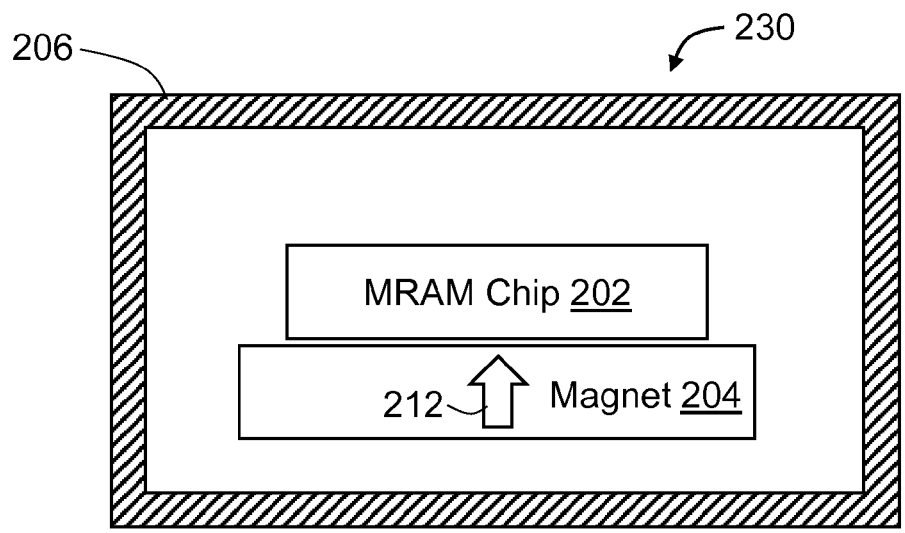
FIG. 6 is a schematic view of still another embodiment in which the permanent magnet is bonded to the MRAM die.

FIG. 6 shows still another embodiment of the present invention in which the permanent magnet 204 is attached to the front or back side of the MRAM die 202 by any suitable adhesive, such as but not limited to epoxy, polymeric glue, or solder. In cases where the permanent magnet 204 is attached to the front side of the MRAM die 202, the permanent magnet 204 may need to have via holes (not shown), through which the electrical connections between the conductive bond pads (not shown) formed on the front side of the MRAM die 202 and the package bond pads (not shown) formed on the package case 206 may pass. The permanent magnet 204 with the permanent magnetization direction 212 substantially perpendicular the layer planes of the magnetic layers and the MRAM die 202 generates the perpendicular magnetic field (not shown) that cancels or counter-balances the offset field in the MRAM die 202.

Figure 7:
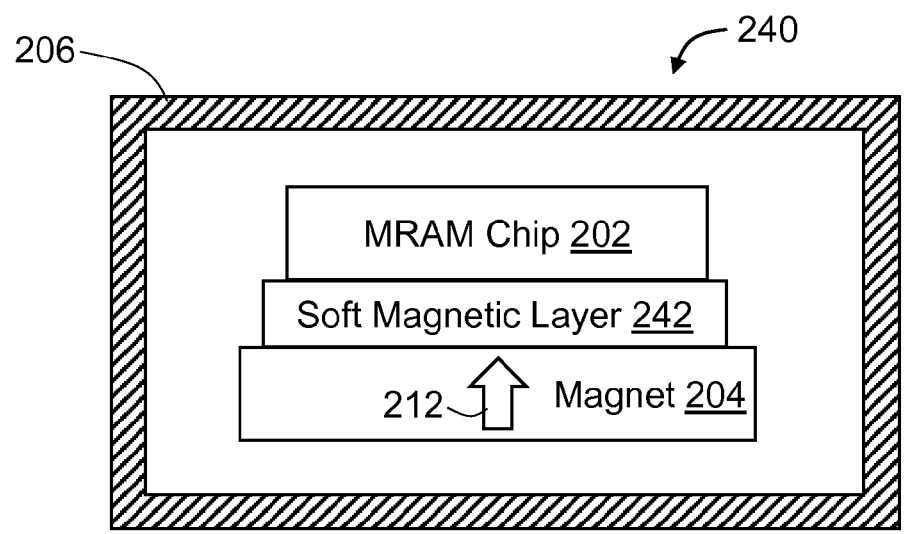
FIG. 7 is a schematic view of yet another embodiment in which a soft magnetic layer is disposed between the MRAM die and the permanent magnet.

Yet another embodiment of the present invention as applied to an MRAM will now be described with reference to FIG. 7. The illustrated memory 240 includes a soft magnetic layer 242 disposed between the MRAM die 202 and the permanent magnet 204. The soft magnetic layer 242 may be disposed adjacent to the front or back side of the MRAM die 202. In cases where the soft magnetic layer 242 is disposed adjacent to the front side of the MRAM die 202, the soft magnetic layer 242 and the permanent magnet 204 may need to have via holes (not shown), through which the electrical connections between the conductive bond pads (not shown) formed on the front side of the MRAM die 202 and the package bond pads (not shown) formed on the package case 206 may pass.

The soft magnetic layer 242 conducts magnetic flux from the permanent magnet 212 towards the MRAM die 202 to counter-balance the offset field. The soft magnetic layer 242 may also help to confine the magnetic flux from the permanent magnet 204 within the package case 206. The soft magnetic layer 242 may have planar dimensions that are greater than those of the MRAM die 202. The magnetic properties of the soft magnetic layer 242 may vary in the layer plane thereof, allowing variation in magnetic flux conducting properties. For example, the magnetic moment of the soft magnetic layer 242 may vary from planar center to edges for generating a more uniform magnetic field. The soft magnetic layer 242 may be made of any "soft" ferromagnetic material having suitably low coercivity. The soft magnetic layer 242 may have a coercivity less than about 0.01 Tesla (T), preferably less than about 0.005 T, more preferably less than about 0.001 T. The soft magnetic layer 242 may be made of a soft ferromagnetic alloy comprising Fe and Ni.

Figure 8:
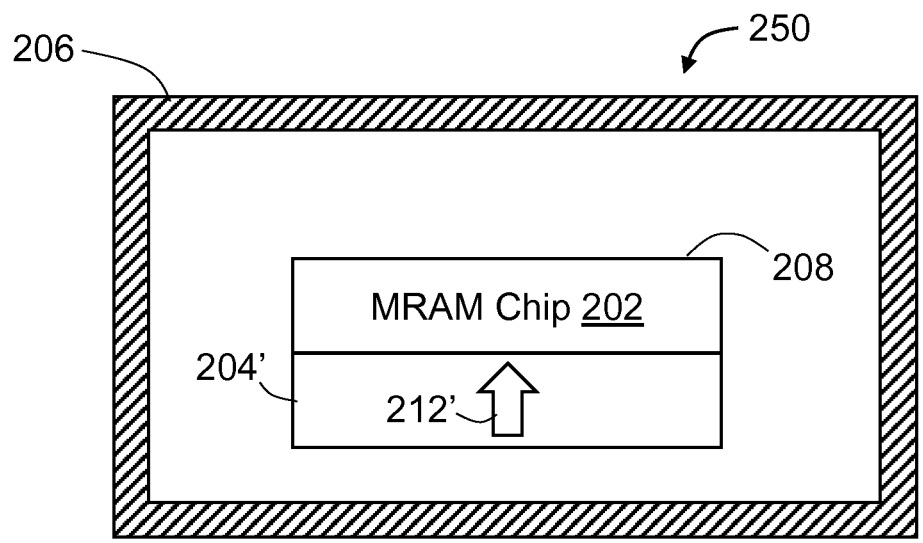
FIG. 8 is a schematic view of still yet another embodiment of the present invention in which the permanent magnet is formed on or bonded to the back side of the wafer prior to dicing.

FIG. 8 illustrates still yet another embodiment of the present invention in which the permanent magnet 204' is formed on or bonded to the back side of the wafer prior to dicing. The permanent magnet 204' has a permanent magnetization direction 212' substantially perpendicular to the layer planes of the magnetic layers in the MRAM die 202. The permanent magnet 204' may be bonded to the back side of the wafer by an adhesive or may be plated onto the back side of the wafer. The permanent magnet 204' and the MRAM die 202 have substantially same planar dimensions because both are cut by the same dicing operation.

Figure 9:
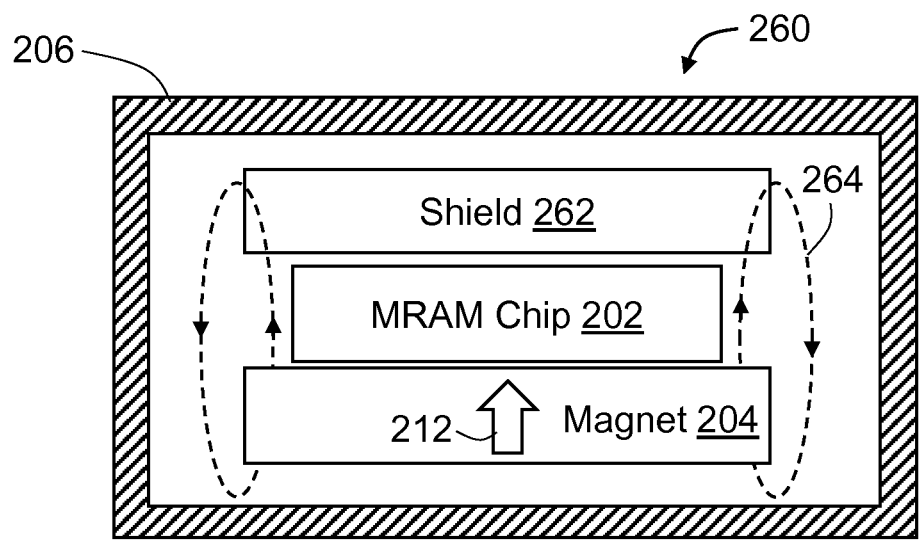
FIG. 9 is a schematic view of yet still another embodiment of the present invention in which a magnetic shield is disposed on one side of the MRAM die opposite the permanent magnet.

Yet still another embodiment of the present invention as applied to an MRAM is illustrated in FIG. 9. The illustrated memory 260 comprises the package case 206, which includes therein the permanent magnet 204 disposed in close proximity to one side of the MRAM die 202 and a magnetic shield 262 disposed on the other side of the MRAM die 202 opposite the permanent magnet 204. The magnetic shield 262 may be in the form of a block or sheet with a block or sheet surface facing one side of the MRAM die 202. The magnetic shield 262 may concentrate magnetic flux 264 from the permanent magnet 204 to the MRAM die 202 and may also help to confine the magnetic flux 264 within the package case 206. The embodiment of FIG. 9 differs from the embodiment of FIGS. 4 and 6 in that the memory 260 includes the magnetic shield 262. Either the magnetic shield 262 or the permanent magnet 204 may have via holes (not shown) to allow electrical connections (not shown) between the MRAM die 202 and the package case 206 to pass through. The magnetic shield 262 may have planar dimensions that are greater than those of the MRAM die 202.

The magnetic shield 262 may be made of any "soft" ferromagnetic material having suitably low coercivity. The magnetic shield 262 may have a coercivity less than about 0.01 Tesla (T), preferably less than about 0.005 T, more preferably less than about 0.001 T. The magnetic shield 262 may be made of a soft ferromagnetic alloy comprising Fe and Ni. Alternatively, the magnetic shield 262 may be made of a composite material comprising soft ferromagnetic particles imbedded in a non-magnetic matrix, such as but not limited to polymer or ceramic material.

Figure 10A:
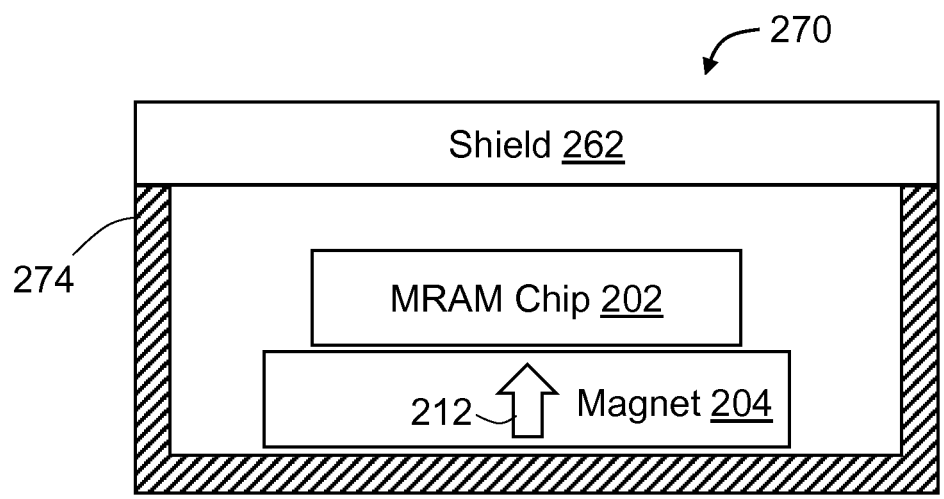
FIGS. 10A and 10B are schematic views of two variations of the embodiment of FIG. 9 in which the magnetic shield forms a part of a package case.
Figure 10B:
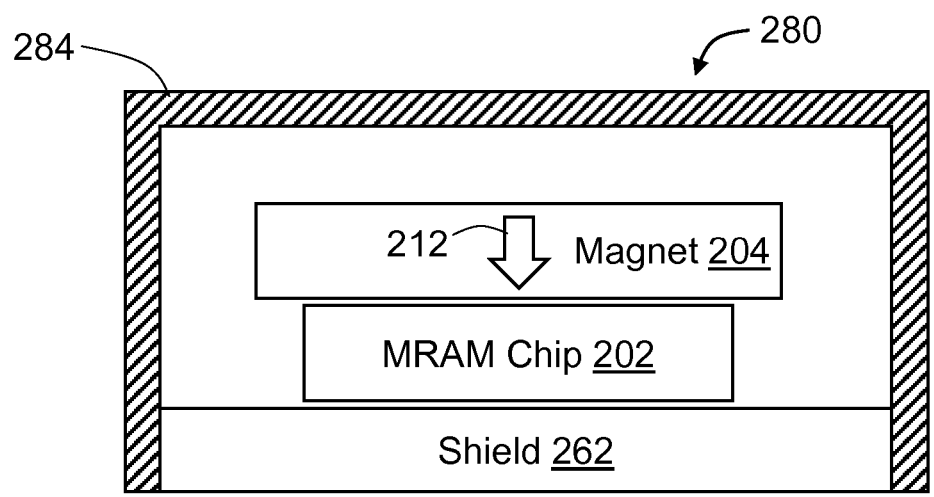

FIGS. 10A and 10B illustrate two variations of the embodiment of FIG. 9 in which the magnetic shield 262 forms a part of a package case. The memory 270 of FIG. 10A has a package case comprising a lower package case 274 capped by the magnetic shield 262 while the memory 280 of FIG. 10B has a package case comprising an upper package case 284 covering the magnetic shield 262, which may also function as a lead frame for the package assembly. The lower and upper package cases 274 and 284 may be made of any suitable insulator material, such as polymer or ceramic material.

Figure 11:
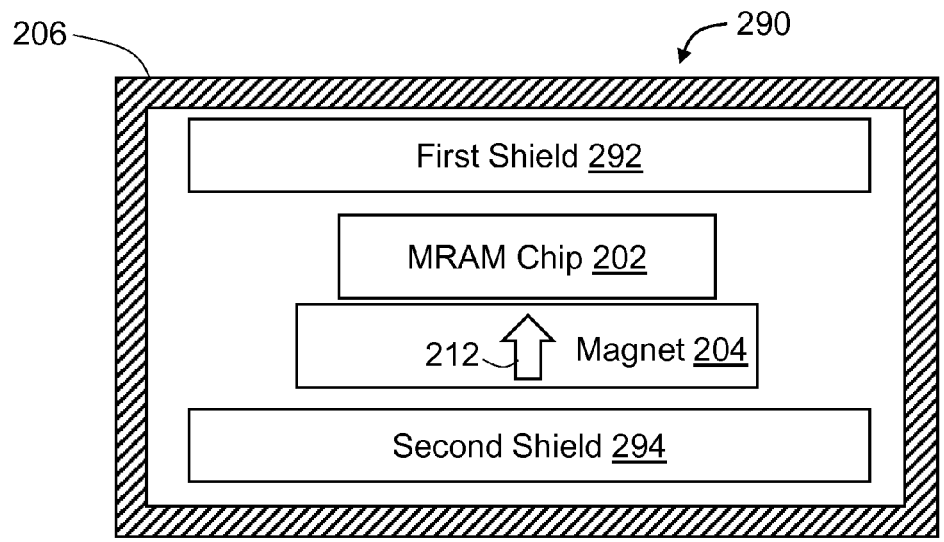
FIG. 11 is a schematic view of still yet another embodiment of the present invention in which the MRAM die and the permanent magnet are disposed between two magnetic shields that may be substantially parallel to each other.

Still yet another embodiment of the present invention as applied to an MRAM is illustrated in FIG. 11. The illustrated memory 290 comprises the package case 206, which includes therein a first magnetic shield 292 and a second magnetic shield 294 separated by the MRAM die 202 and the permanent magnet 204. The first and second magnetic shields 292 and 294 may be in the form of a block or sheet and may be substantially parallel to each other. The embodiment of FIG. 11 differs from the embodiment of FIG. 9 in that the memory 290 has two magnetic shields 292 and 294, which may further concentrate magnetic flux from the permanent magnet 204 to the MRAM die 202 and may further confine the magnetic flux within the package case 206. The additional magnetic shield 294 is disposed on one side of the permanent magnet 204 opposite the MRAM die 202. A block or sheet surface of the second magnetic shield 294 faces a block or sheet surface of the permanent magnet 204. The magnetic shields 292 and 294 may have planar dimensions that are greater than those of the MRAM die 202. Moreover, at least one the magnetic shields 292 and 294 may alternatively form a part of the package case as shown in FIGS. 10A and 10B.

The magnetic shields 292 and 294 may be made of any "soft" ferromagnetic material having suitably low coercivity and may have a coercivity less than about 0.01 Tesla (T), preferably less than about 0.005 T, more preferably less than about 0.001 T. At least one of the magnetic shields 292 and 294 may be made of a soft ferromagnetic alloy comprising Fe and Ni. Alternatively, at least one of the magnetic shields 292 and 294 may be made of a composite material comprising soft ferromagnetic particles imbedded in a non-magnetic matrix, such as but not limited to polymer or ceramic material.

Figure 12:
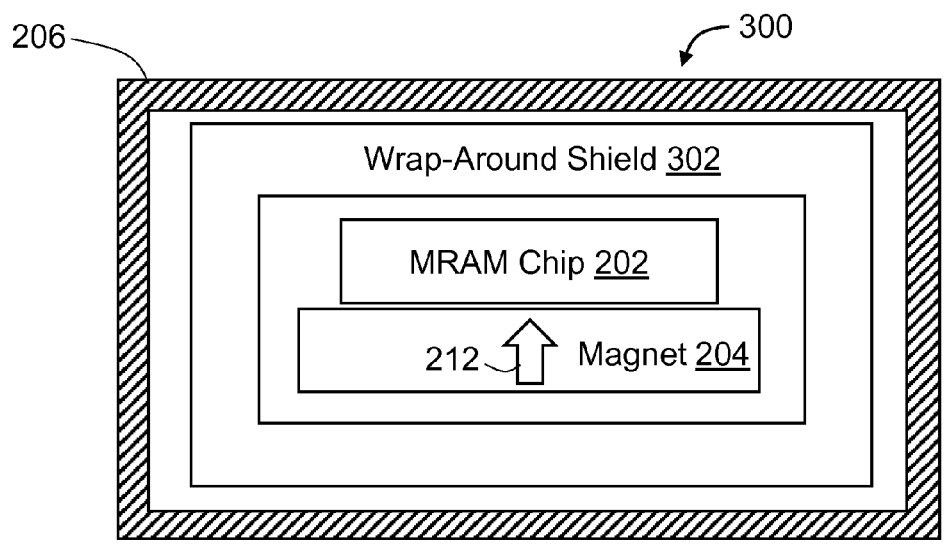
FIG. 12 is a schematic view of yet still another embodiment of the present invention in which the MRAM die and the permanent magnet are surrounded by a wrap-around magnetic shield.

FIG. 12 illustrates yet still another embodiment of the present invention in which the MRAM die 202 and the permanent magnet 204 are surrounded by a wrap-around magnetic shield 302, which may still further concentrate magnetic flux from the permanent magnet 204 to the MRAM die 202 and may still further confine the magnetic flux within the package case 206. The wrap-around magnetic shield 302 may have four, five, or six sides with the fifth and sixth sides formed along lateral sides parallel to the cross-section drawing. The wrap-around magnetic shield 302 may be constructed from one piece or multiple pieces of soft ferromagnetic materials having suitably low coercivity. Each piece of the wrap-around magnetic shield 302 may have a coercivity less than about 0.01 Tesla (T), preferably less than about 0.005 T, more preferably less than about 0.001 T. At least one piece of the wrap-around magnetic shield 302 may be made of a soft magnetic alloy comprising Fe and Ni. Alternatively, at least one piece of the wrap-around magnetic shield 302 may be made of a composite material comprising soft ferromagnetic particles imbedded in a non-magnetic matrix, such as but not limited to polymer or ceramic material.

Figure 13:
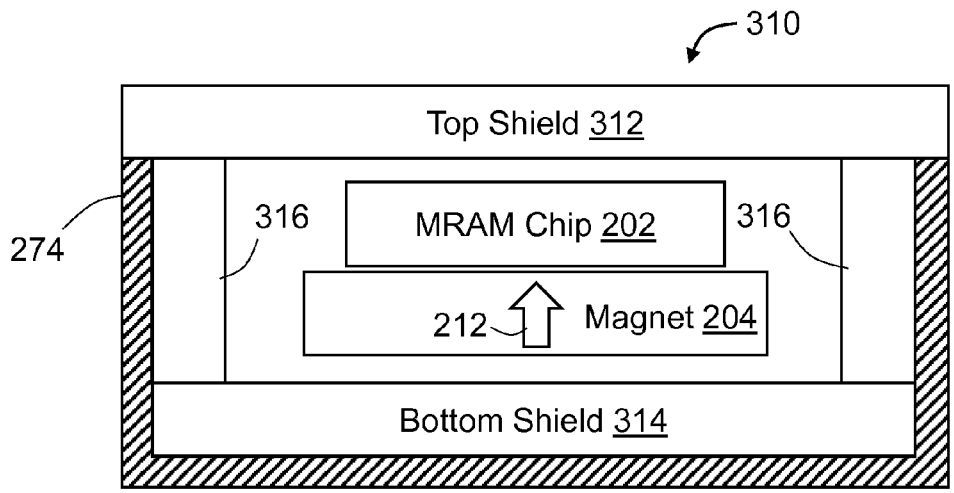
FIG. 13 is a schematic view of a variation of the embodiment of FIG. 12 in which a piece of the wrap-around magnetic shield forms a part of a package case.

FIG. 13 illustrates a variation of the embodiment of FIG. 12 in which one piece of the wrap-around shield forms a part of the package case. The illustrated memory 310 includes the MRAM die 202 and the permanent magnet 204 surrounded by a wrap-around magnetic shield comprising a top magnetic shield 312, a bottom magnetic shield 314, and side magnetic shields 316 disposed on at least two lateral sides. One or two additional side magnetic shields 316 may also be disposed along other lateral sides parallel to the cross-section drawing. Analogous to the memory 270 of FIG. 10A, the top magnetic shield 312 of the memory 310 also forms a part of the package case which comprises the lower package case 274 capped by the top magnetic shield 312. Similarly, the bottom magnetic shield 314 of the memory 310 may also form a part of the package case by functioning as a lead frame as illustrated in FIG. 10B.

Each of the magnetic shields 312-316 may have a coercivity less than about 0.01 Tesla (T), preferably less than about 0.005 T, more preferably less than about 0.001 T. At least one of the magnetic shields 312-316 may be made of a soft ferromagnetic alloy comprising Fe and Ni. Alternatively, at least one of the magnetic shields 312-316 may be made of a composite material comprising soft ferromagnetic particles imbedded in a non-magnetic matrix, such as but not limited to polymer or ceramic material.

Figure 14:
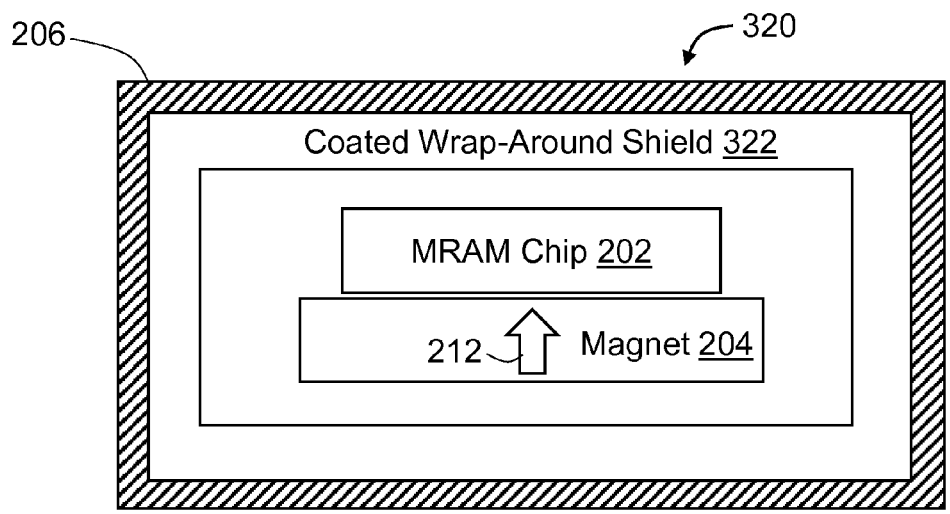
FIG. 14 is a schematic view of another variation of the embodiment of FIG. 12 in which a wrap-around magnetic shield is coated onto the inner wall of the package case.

FIG. 14 illustrates another variation of the embodiment of FIG. 12 in which a wrap-around magnetic shield 322 is coated onto the inner walls of the package case 206. The wrap-around magnetic shield 322 may also be coated on the lateral walls of the package case 206 parallel to the cross-section drawing. The coated wrap-around magnetic shield 322 may be made of a composite material comprising soft ferromagnetic particles imbedded in a polymeric matrix.

Figure 15:
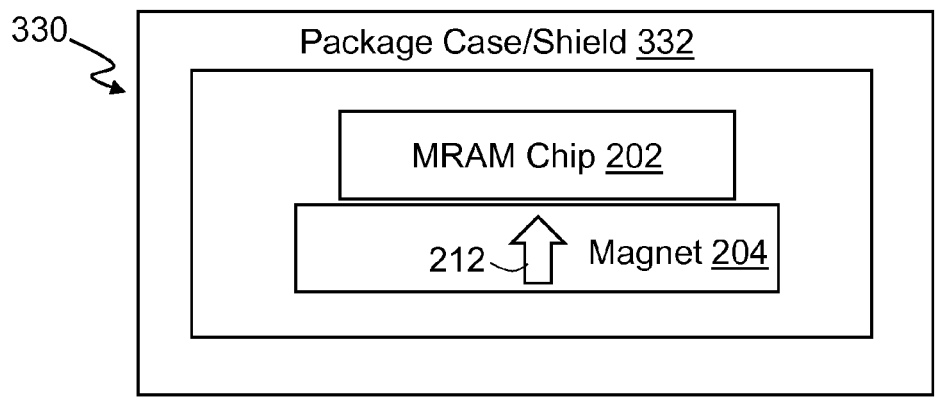
FIG. 15 is a schematic view of still another variation of the embodiment of FIG. 12 in which a package case also functions as a wrap-around magnetic shield.

FIG. 15 illustrates still another variation of the embodiment of FIG. 12 in which a package case 332 also serves as a wrap-around magnetic shield. The package case/magnetic shield 332 encapsulates therein the MRAM die 202 and the permanent magnet 204. The package case/magnetic shield 332 may be made of a composite material comprising soft ferromagnetic particles imbedded in an insulator matrix, such as but not limited to polymer or ceramic material.

Figure 16:
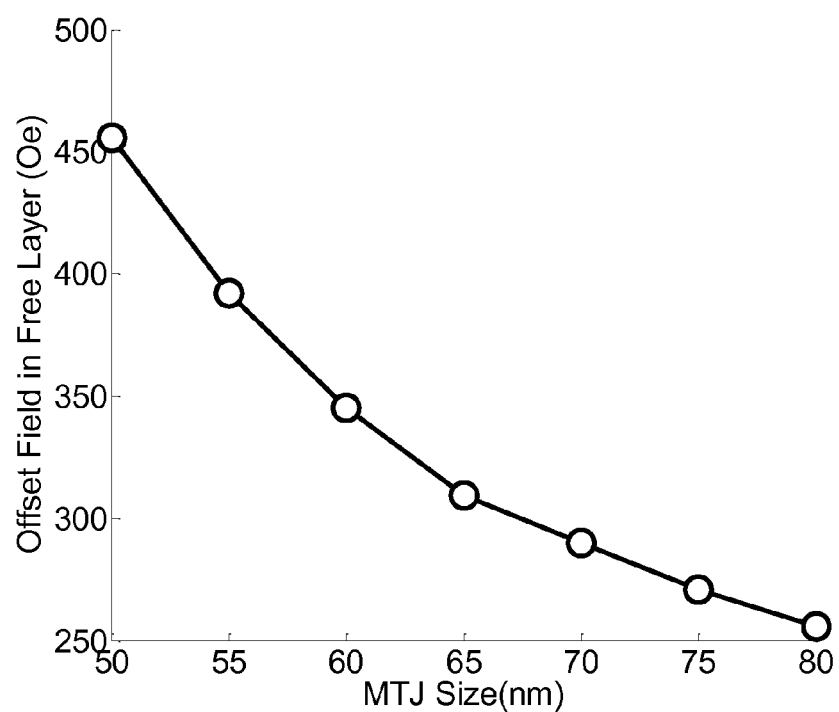
FIG. 16 is a plot illustrating the dependence of offset field on MTJ size.

The present invention may advantageously accommodate within-wafer variation and/or wafer-to-wafer variation of the offset field arisen from wafer processing. FIG. 16 illustrates that the offset field of the magnetic free layer varies with the MTJ size for a given MTJ stack structure. Because the MTJ size may vary within a wafer and from wafer to wafer, the offset field and thus the switching behavior may vary accordingly. The present invention may accommodate such variations since different MRAM dies may use different permanent magnets to eliminate the offset fields thereof. In contrast, the prior art method of using additional magnetic layers to counter-balance the stray field exerted on the magnetic free layer by the magnetic reference layer is disadvantageously limited to constant magnetic layer thickness and thus constant counter-balancing magnetic field, which cannot accommodate any wafer processing variation.

The previously described embodiments of the present invention have many advantages, including symmetric switching behavior and low cost. It is important to note, however, that the invention does not require that all the advantageous features and all the advantages need to be incorporated into every embodiment of the present invention.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic random access memory (MRAM) comprising:
    an MRAM die having a front side that includes therein a plurality of selection transistors and a plurality of perpendicular magnetic tunnel junction (MTJ) memory elements formed thereon and a back side;
    a sheet of permanent magnet disposed in close proximity to said MRAM die with a sheet surface facing said front side or back side of said MRAM die, said sheet of permanent magnet having a permanent magnetization direction substantially perpendicular to said sheet surface; and
    a package case encapsulating said MRAM die and said sheet of permanent magnet.

2. The magnetic random access memory of claim 1, wherein each of said plurality of perpendicular MTJ memory elements comprises:
    a magnetic reference layer having a fixed magnetization substantially perpendicular to a layer plane thereof;
    a magnetic free layer having a variable magnetization direction substantially perpendicular to a layer plane thereof; and
    an insulating tunnel junction layer formed between said magnetic reference and free layers.

3. The magnetic random access memory of claim 1, wherein said sheet surface faces said back side of said MRAM die.

4. The magnetic random access memory of claim 1, wherein said sheet surface is bonded to said back side of said MRAM die.

5. The magnetic random access memory of claim 1, wherein said sheet of permanent magnet is made of a rare-earth magnet, a hard ferrite magnet, or a hard magnetic alloy comprising cobalt, nickel, and aluminum.

6. The magnetic random access memory of claim 1, further comprising a layer of soft ferromagnetic material formed between said MRAM die and said sheet of permanent magnet.

7. The magnetic random access memory of claim 1, further comprising a first soft magnetic shield formed on a side of said MRAM die opposite said sheet of permanent magnet.

8. The magnetic random access memory of claim 1, further comprising a wrap-around soft magnetic shield that surrounds said MRAM die and said sheet of permanent magnet.

9. The magnetic random access memory of claim 1, wherein said package case is made of an insulator material.

10. The magnetic random access memory of claim 1, wherein said package case is partly constructed of a soft ferromagnetic material.

11. The magnetic random access memory of claim 1, wherein said MRAM die is fabricated by dicing a wafer substrate with device layers formed thereon.

12. The magnetic random access memory of claim 2, wherein each of said plurality of perpendicular MTJ memory elements further comprises a magnetic fixed layer coupled to said magnetic reference layer through an anti-ferromagnetic coupling layer.

13. The magnetic random access memory of claim 7, wherein said first soft magnetic shield is made of a soft ferromagnetic alloy comprising nickel and iron.

14. The magnetic random access memory of claim 7, further comprising a second soft magnetic shield formed on a side of said sheet of permanent magnet opposite said MRAM die.

15. The magnetic random access memory of claim 7, wherein said first soft magnetic shield has a discrete, planar shape and is isolated from other magnetic structures.

16. The magnetic random access memory of claim 14, wherein said second soft magnetic shield is made of a soft ferromagnetic alloy comprising nickel and iron.

17. A magnetic random access memory (MRAM) comprising:
- an MRAM die having a front side that includes therein a plurality of perpendicular magnetic tunnel junction (MTJ) memory elements and a back side; and
- a sheet of permanent magnet disposed in close proximity to said MRAM die with a sheet surface facing said front side or back side of said MRAM die, said sheet of permanent magnet having a permanent magnetization direction substantially perpendicular to said sheet surface,
- wherein said sheet of permanent magnet has variable thickness.

18. A magnetic random access memory (MRAM) comprising:
- an MRAM die having a front side that includes therein a plurality of perpendicular magnetic tunnel junction (MTJ) memory elements and a back side;
- a sheet of permanent magnet disposed in close proximity to said MRAM die with a sheet surface facing said front side or back side of said MRAM die, said sheet of permanent magnet having a permanent magnetization direction substantially perpendicular to said sheet surface; and
- a package case encapsulating said MRAM die and said sheet of permanent magnet,
- wherein said package case is made of a composite material comprising soft ferromagnetic particles imbedded in an insulator matrix.

* * * * *